United States Patent
Bianchi et al.

(10) Patent No.: US 7,471,103 B2
(45) Date of Patent: Dec. 30, 2008

(54) METHOD FOR IMPLEMENTING COMPLEX LOGIC WITHIN A MEMORY ARRAY

(75) Inventors: Andrew James Bianchi, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/567,581

(22) Filed: Dec. 6, 2006

(65) Prior Publication Data

US 2008/0136447 A1   Jun. 12, 2008

(51) Int. Cl.
*G06F 7/38* (2006.01)
*H03K 19/173* (2006.01)

(52) U.S. Cl. .......................................... 326/38; 326/37
(58) Field of Classification Search .............. 326/37–50
See application file for complete search history.

(56) References Cited

U.S. PATENT DOCUMENTS 6,127,845 A * 10/2000 Kolze et al. .................... 326/41
6,885,219 B2 * 4/2005 Piasecki et al. ................ 326/41

* cited by examiner

*Primary Examiner*—Rexford Barnie
*Assistant Examiner*—Matthew C Tabler
(74) *Attorney, Agent, or Firm*—Duke W. Yee; Diana R. Gerhardt; Lisa L. B. Yociss

(57) ABSTRACT

A logic gate is described that implements complex logic within a memory array. The logic gate receives at least three of a first storage cell signal, a second storage cell signal, a first external signal, or a second external signal at a first input circuitry and second input circuitry. The logic gate then performs one of a set of logic functions using the first storage cell signal, the second storage cell signal, the first external signal, or the second external signal. The set of logic functions includes at least one of a matching function, an OR-AND function, or an AND function.

8 Claims, 6 Drawing Sheets

METHOD FOR IMPLEMENTING COMPLEX LOGIC WITHIN A MEMORY ARRAY

BACKGROUND

1. Field of the Invention

The present application relates generally to memory arrays. More specifically, the present application relates generally to a method and apparatus for implementing complex logic within a memory array.

2. Description of the Related Art

Content-addressable memory (CAM) is a special type of computer memory used in certain very high speed searching applications. Content-addressable memory may also be known as associative memory, associative storage, or associative array.

Unlike standard computer memory, random access memory (RAM) in which the user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found, and in some architectures, it also returns the data word or other associated pieces of data. Thus, a CAM is the hardware embodiment of what in software terms would be called an associative array.

Because a CAM is designed to search its entire memory in a single operation, it is much faster than RAM in virtually all search applications. Unlike a RAM chip, which has simple storage cells, each individual memory bit in a fully parallel CAM must have its own associated comparison circuit to detect a match between the stored bit and the input bit. However, some CAMs require more than just a bit-to-bit comparison. A bit-to-bit comparison can be achieved with a XNOR gate and then ANDing each result to find if an entire line matches. A XNOR gate is a digital logic gate that implements logical equality. For more complicated CAMs, just a XNOR gate itself is not sufficient to perform the desired logical function.

SUMMARY

The different aspects of the illustrative embodiments provide a logic gate that implements complex logic within a memory array. The illustrative embodiments provide an output node that is coupled to a fist input circuitry and a second input circuitry. The illustrative embodiments also provide an output drive circuitry that is coupled to the output node and a logic gate output node. The illustrative embodiments receive, in the logic gate, at least three of a first storage cell signal, a second storage cell signal, a first external signal, or a second external signal at the first input circuitry and the second input circuitry. The illustrative embodiments perform, in the logic gate, one of a set of logic functions using the first storage cell signal, the second storage cell signal, the first external signal, or the second external signal. The set of logic functions includes at least one of a matching function, an OR-AND function, or an AND function.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

DETAILED DESCRIPTION OF THE PREFERRED EMBODIMENT

Figure 1:
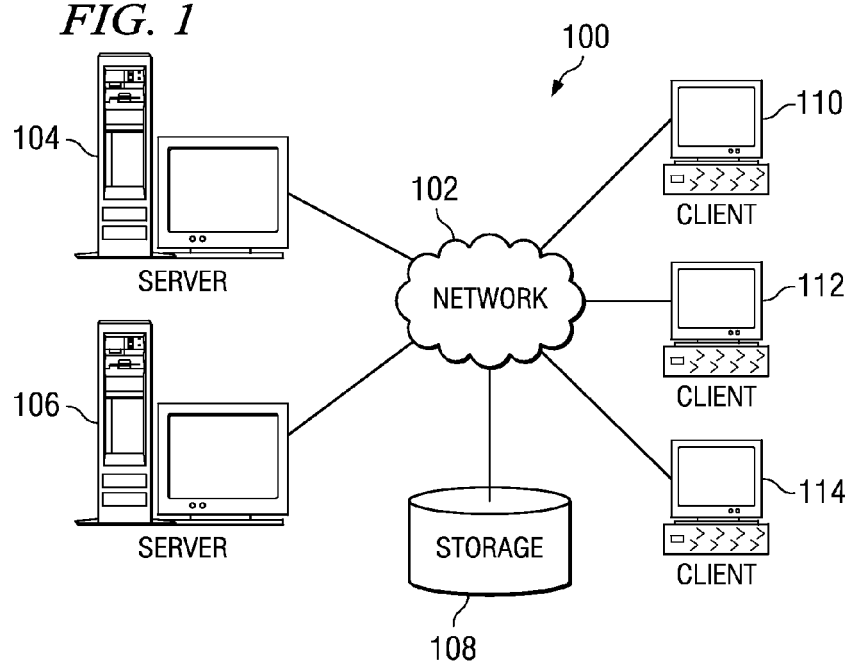
FIG. 1 depicts a pictorial representation of a network of data processing systems in which the illustrative embodiments may be implemented.
Figure 2:
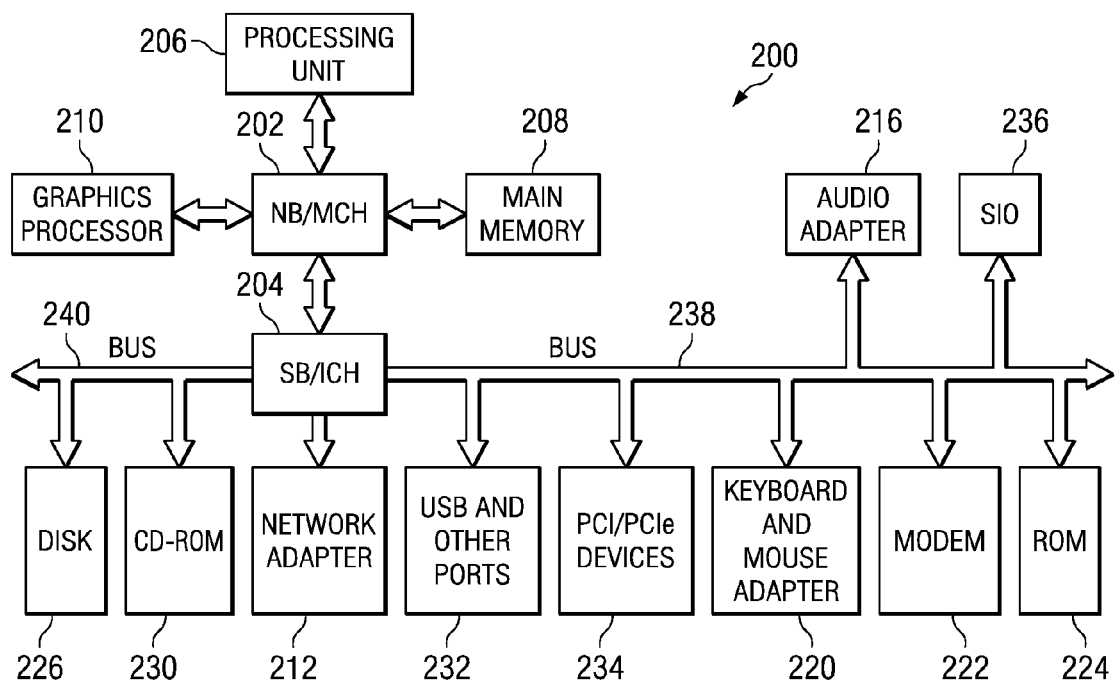
FIG. 2 shows a block diagram of a data processing system in which the illustrative embodiments may be implemented.

The illustrative embodiments provide for a logic gate that may be used to perform multiple logical functions based on the gate's input combinations. This gate is then combined with the storage cell. Thus, the same storage cell can be used for different content-addressable memory (CAM) functions. With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

With reference now to the figures, FIG. 1 depicts a pictorial representation of a network of data processing systems in which the illustrative embodiments may be implemented. Network data processing system 100 is a network of computers in which embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. These clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for different embodiments.

With reference now to FIG. 2, a block diagram of a data processing system is shown in which the illustrative embodiments may be implemented. Data processing system 200 is an example of a computer, such as server 104 or client 110 in FIG. 1, in which computer usable code or instructions implementing the processes may be located for the illustrative embodiments.

In the depicted example, data processing system 200 employs a hub architecture including a north bridge and memory controller hub (MCH) 202 and a south bridge and input/output (I/O) controller hub (ICH) 204. Processing unit 206, main memory 208, and graphics processor 210 are coupled to north bridge and memory controller hub 202. Processing unit 206 may contain one or more processors and even may be implemented using one or more heterogeneous processor systems. Graphics processor 210 may be coupled to the MCH through an accelerated graphics port (AGP), for example.

In the depicted example, local area network (LAN) adapter 212 is coupled to south bridge and I/O controller hub 204 and audio adapter 216, keyboard and mouse adapter 220, modem 222, read only memory (ROM) 224, universal serial bus (USB) ports and other communications ports 232, and PCI/PCIe devices 234 are coupled to south bridge and I/O controller hub 204 through bus 238, and hard disk drive (HDD) 226 and CD-ROM drive 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be coupled to south bridge and I/O controller hub 204.

An operating system runs on processing unit 206 and coordinates and provides control of various components within data processing system 200 in FIG. 2. The operating system may be a commercially available operating system such as Microsoft® Windows® XP (Microsoft and Windows are trademarks of Microsoft Corporation in the United States, other countries, or both). An object oriented programming system, such as the Java™ programming system, may run in conjunction with the operating system and provides calls to the operating system from Java programs or applications executing on data processing system 200. Java and all Java-based trademarks are trademarks of Sun Microsystems, Inc. in the United States, other countries, or both.

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in north bridge and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

The illustrative embodiments provide for a logic gate combined with the storage cell that may be used to perform multiple logical functions based on the gate's input combinations. The logic gate has four-inputs, two from the storage cell and two from an external source. The two external source inputs may be assigned based on the type of function that is to be performed by the logic gate. This single storage cell may be used for different types of CAMs. The same storage cell may be used in a single row, and each bit may actually perform a different function. Thus, the described logic gate reduces the number of layout versions of the storage cell.

Figure 3:
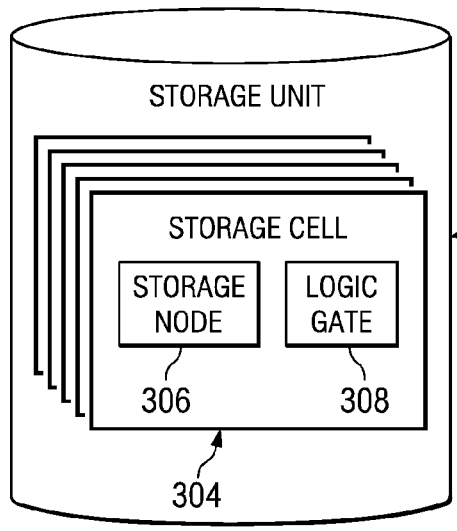
FIG. 3 is a functional block diagram of a storage cell where the illustrative embodiments may be implemented in accordance with an illustrative embodiment.

FIG. 3 is a functional block diagram of a storage cell where the illustrative embodiments may be implemented in accordance with an illustrative embodiment. Storage unit 302, which is a storage unit, such as storage unit 108 of FIG. 1, contains sets of storage cell 304. Storage cell 304 includes storage node 306 and logic gate 308. A storage cell may also be referred to as a memory cell and a set of storage cells may be one or more storage cells. Storage node 306 is a specialized memory cache within storage cell 304. Logic gate 308 performs multiple logical functions based on the gate's input combinations, which will be further described below.

Figure 4:
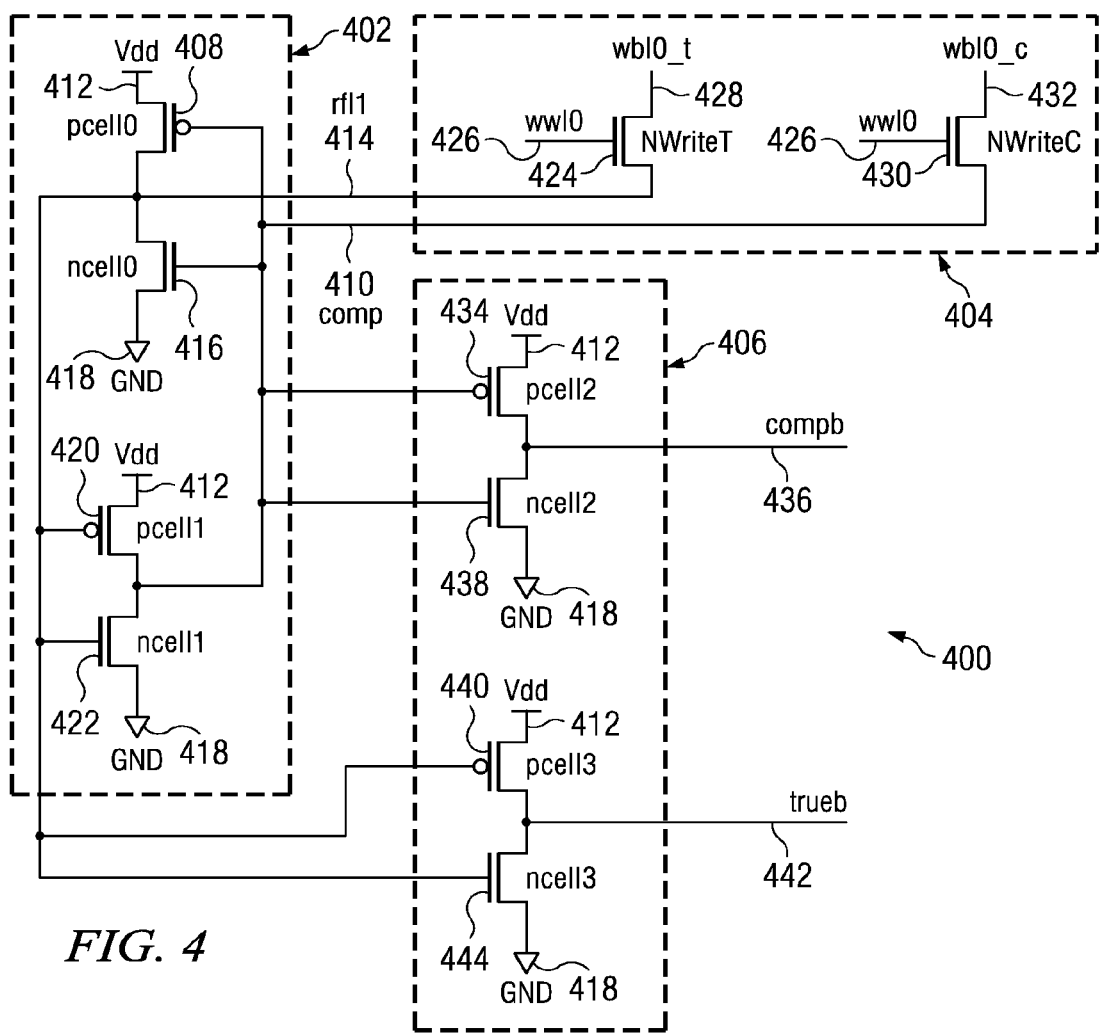
FIG. 4 depicts an exemplary storage cell in accordance with an illustrative embodiment.

FIG. 4 depicts an exemplary storage cell in accordance with an illustrative embodiment. Storage cell 400 may be a storage cell, such as storage cell 304 of FIG. 3. Storage cell 400 includes inverter/inverter feedback circuitry 402, write port circuitry 404, and output drive circuitry 406. Inverter/inverter feedback circuitry 402 includes:

1) pcell0 408, which is a Positive Channel Field Effect Transistor (PFET) device, has its gate input connected to signal node comp 410, its source input connected to drain voltage (VDD) 412, and its drain input connected to signal node rfl1 414. VDD may also be referred to as a high signal.
2) ncell0 416, which is a Negative Channel Field Effect Transistor (NFET) device, has its gate input connected to signal node comp 410, its source input connected to ground (GND) 418, and its drain input connected to signal node rfl1 414. GND may also be referred to as a low signal.

3) pcell1 420, which is a PFET device, has its gate input connected to signal node rfl1 414, its source input connected to VDD 412, and its drain input connected to signal node comp 410.

4) ncell1 422, which is a NFET device, has its gate input connected to signal node rfl1 414, its source input connected to GND 418, and its drain input connected to signal node comp 410.

Write port circuitry 404 includes:

1) NWriteT 424, which is a NFET device, has its gate input connected to signal node wwl0 426, its source input connected to signal node wbl0_t 428, and its drain input connected to signal node rfl1 414.

2) NWriteC 430, which is a NFET device, has its gate input connected to signal node wwl0 426, its source input connected to signal node wbl0_c 432, and its drain input connected to signal node comp 410.

Output drive circuitry 406 includes:

1) pcell2 434, which is a PFET device, has its gate input connected to signal node comp 410, its source input connected to VDD 412, and its drain input connected to signal node compb 436.

2) ncell2 438, which is a NFET device, has its gate input connected to signal node comp 410, its source input connected to GND 418, and its drain input connected to signal node compb 436.

3) pcell3 440, which is a PFET device, has its gate input connected to signal node rfl1 414, its source input connected to VDD 412, and its drain input connected to signal node trueb 442.

4) ncell3 444, which is a NFET device, has its gate input connected to signal node rfl1 414, its source input connected to GND 418, and its drain input connected to signal node trueb 442.

A PFET device may be referred to as a pull-up transistor, while a NFET device may be referred to as a pull-down transistor.

A person versed in the art will appreciate that when signal node wwl0 426 is activated, data is written into storage cell 400 by transferring the signals of signal node wbl0_t 428 and signal node wbl0_c 432 into signal node rfl1 414 and signal node comp 410 with write port circuitry 404 and further being held by inverter/inverter circuitry 402 when signal node wwl0 426 is deactivated. A person versed in the art will further appreciate that the signals of signal node comp 410 and signal node rfl1 414 may be seen on signal node trueb 442 and signal node compb 436 with output drive circuitry 406 and will be the place of choice when the signals of signal node rfl1 414 and signal node comp 410 are needed.

Figures 5, 6:
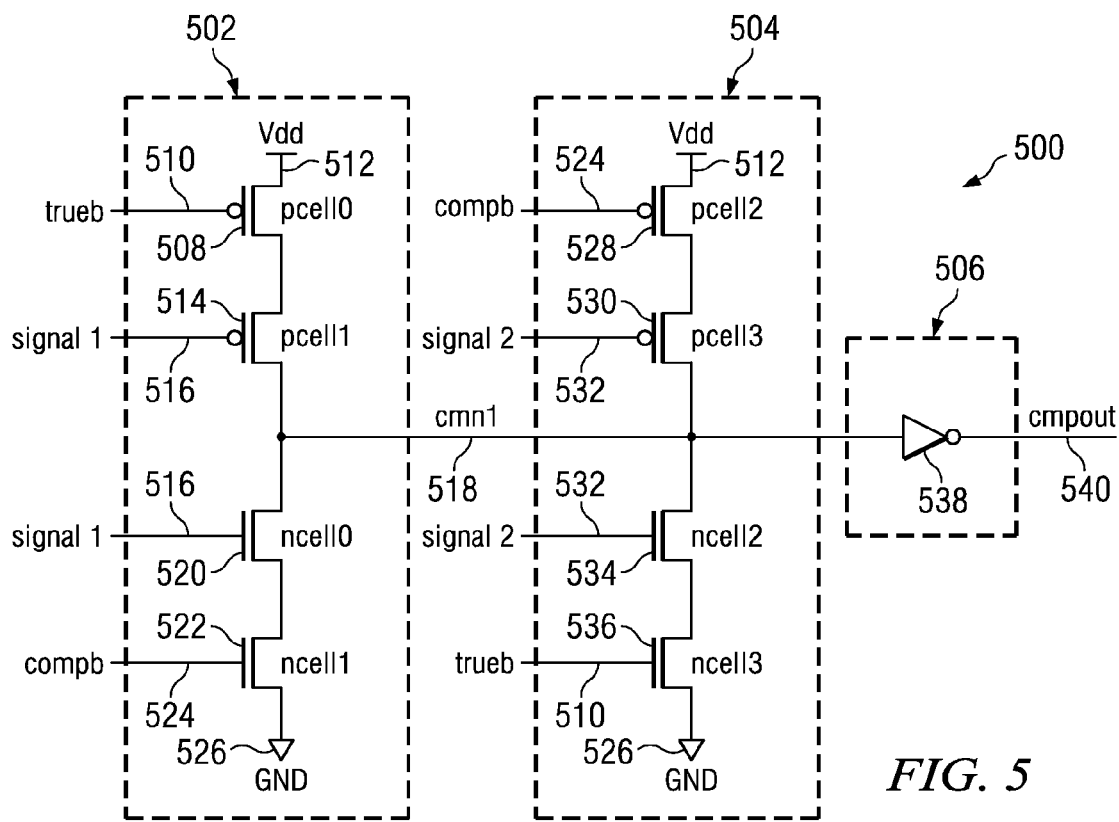
FIG. 5 depicts an exemplary logic gate used in conjunction with a storage cell in accordance with an illustrative embodiment.
FIG. 6 illustrates truth tables of the logic performed by a logic gate in accordance with an illustrative embodiment.

FIG. 5 depicts an exemplary logic gate used in conjunction with a storage cell in accordance with an illustrative embodiment. Logic gate 500 is a logic gate, such as logic gate 308 of FIG. 3. Logic gate 500 performs multiple logical functions based on the gate's input combinations. Logic gate 500 includes first input circuitry 502, second input circuitry 504, and output drive circuitry 506. First input circuitry 502 includes:

1) pcell0 508, which is a PFET device, has its gate input connected to signal node trueb 510, its source input connected to drain voltage (VDD) 512, and its drain input connected to the source input of pcell1 514.

2) pcell1 514, which is a PFET device, has its gate input connected to signal node signal 1 516, its source input connected to the drain input of pcell0 508, and its drain input connected to signal node cmn1 518.

3) ncell0 520, which is a NFET device, has its gate input connected to signal node signal 1 516, its source input connected to the source input of ncell1 522, and its drain input connected to signal node cmn1 518.

4) ncell1 522, which is a NFET device, has its gate input connected to signal node compb 524, its source input connected to GND 526, and its drain input connected to the drain input of ncell0 520.

Second input circuitry 504 includes:

1) pcell2 528, which is a PFET device, has its gate input connected to signal node compb 524, its source input connected to drain voltage (VDD) 512, and its drain input connected to the source input of pcell3 530.

2) pcell3 530, which is a PFET device, has its gate input connected to signal node signal 2 532, its source input connected to the drain input of pcell2 528, and its drain input connected to signal node cmn1 518.

3) ncell2 534, which is a NFET device, has its gate input connected to signal node signal 2 532, its source input connected to the source input of ncell3 536, and its drain input connected to signal node cmn1 518.

4) ncell3 536, which is a NFET device, has its gate input connected to signal node trueb 510, its source input connected to GND 526, and its drain input connected to the drain input of ncell2 534.

Output drive circuitry 506 includes inverter 538 that is connected between signal node cmn1 518 and output signal node cmpout0 540.

A PFET device may be referred to as a pull-up transistor, while a NFET device may be referred to as a pull-down transistor.

A person versed in the art will appreciate that logic gate 500 has two signals, signal node trueb 510 and signal node compb 524, which are the true and complement signals of the storage cell, such as storage cell 400 of FIG. 4. The other two connections, signal node signal 1 516 and signal node signal 2 532, are from an external source. Signal node trueb 510 is from the storage cell's true side, such as signal node trueb 442 of FIG. 4, and signal node compb 524, such as signal node compb 436 of FIG. 4, is from the storage cells's complement side. As a result, signal node compb 524 is the opposite value of signal node trueb 510. The two external signals are signal node signal 1 516 and signal node signal 2 532. The traditional XOR function is performed by connecting signal node signal 1 516 and signal node signal 2 532 to a signal, such as signal node trueb 510, and its complement, such as signal node compb 524.

FIG. 6 illustrates truth tables of the logic performed by a logic gate, such as logic gate 500 of FIG. 5, in accordance with an illustrative embodiment. In truth table 602, if signal 2 604 is tied to drain voltage (VDD) represented by 1, then cmpout 606 is 1 when either of signal 1 608 or trueb 610 are 1. In truth table 612, if signal 1 614 is tied to ground (GDN) represented by 0, then cmpout 616 is 1 when signal 2 618 is 1 and trueb 620 is 1.

Figure 7:
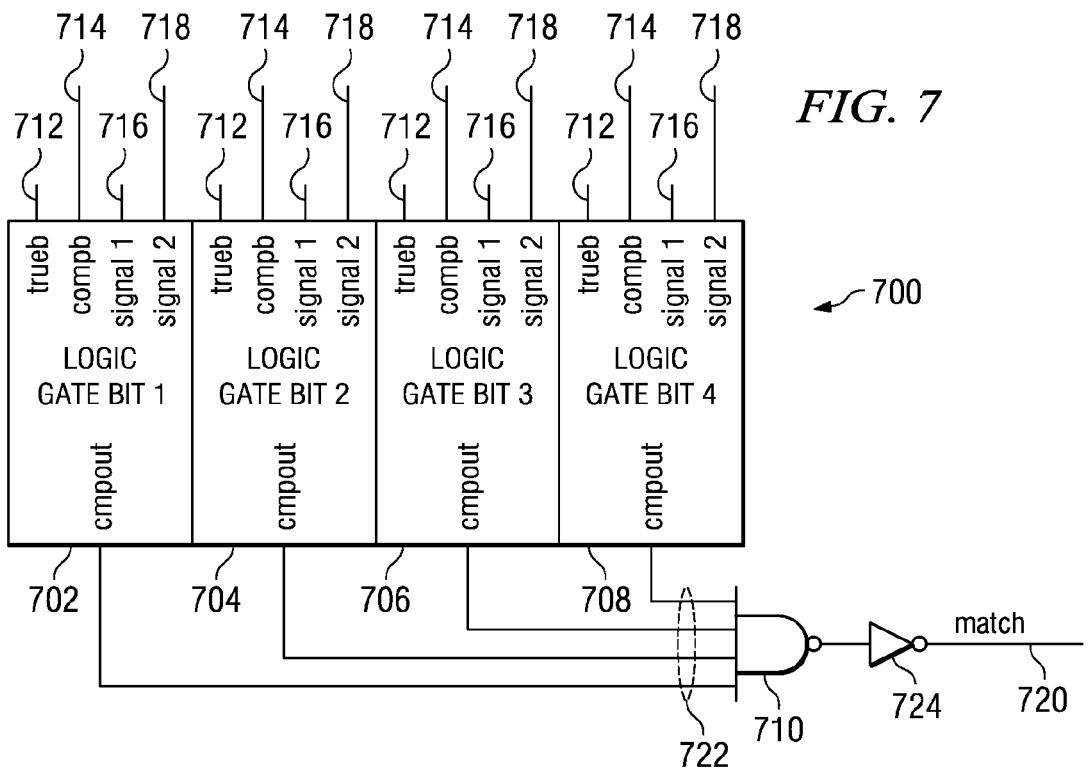
FIG. 7 illustrates an exemplary "matching" function using a logic gate in accordance with an illustrative embodiment.

FIG. 7 illustrates an exemplary "matching" function using a logic gate, such as logic gate 500 of FIG. 5, in accordance with an illustrative embodiment. Circuitry 700 is a four bit "matching" circuitry. Circuitry 700 includes logic gates 702, 704, 706, and 708 and NAND gate 710. In circuitry 700, none of trueb 712, compb 714, signal 1 716, or signal 2 718 are initially grounded or have a drain voltage applied. Thus, match 720 only occurs if the bits analyzed by logic gates 702, 704, 706, and 708 and output at cmpout signal 722 into NAND gate 710 all match. Trueb 712 and compb 714 inputs are fed by complementary signals and signal1 716 and signal2 718 are fed by complementary inputs. When trueb 712 and signal2 718 are the same and compb 714 and signal1 716 are the same, the output of cmpout signal 722 signals a match for that bit. NAND gate 710 and inverter 724 combines all of cmpout signal 722 to signal a match on all 4 bits.

Figure 8:
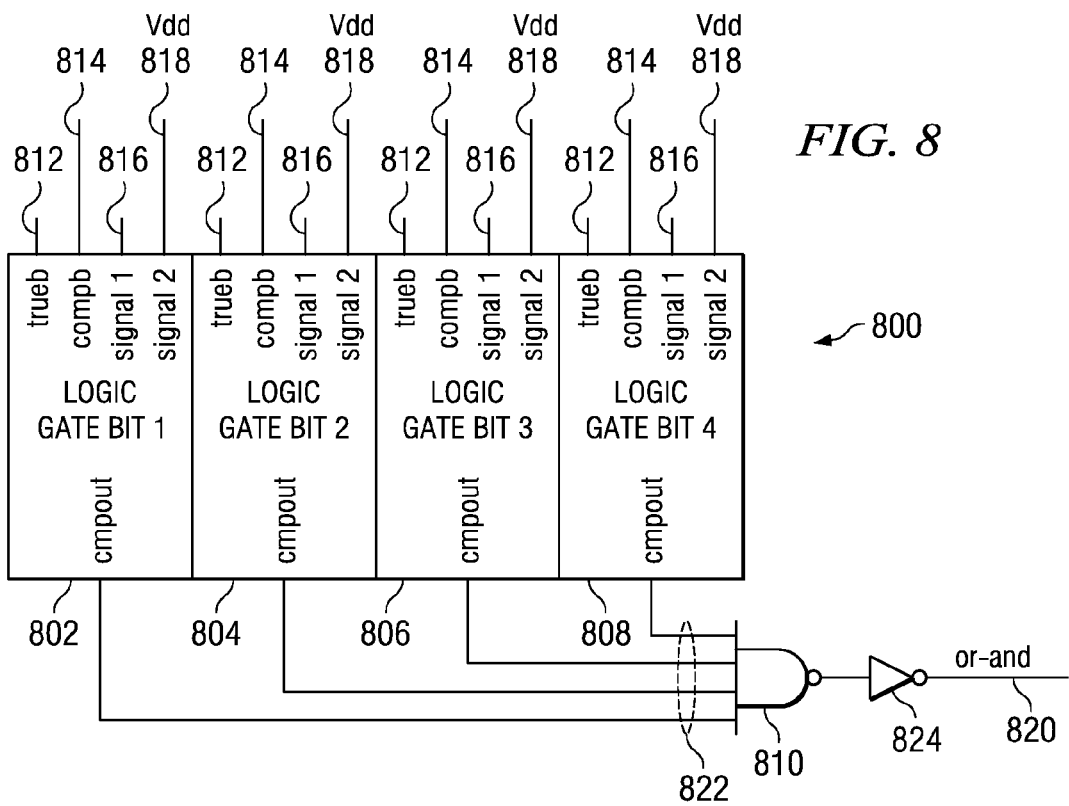
FIG. 8 illustrates an exemplary "OR-AND" function using a logic gate in accordance with an illustrative embodiment.

FIG. 8 illustrates an exemplary "OR-AND" function using a logic gate, such as logic gate 500 of FIG. 5, in accordance with an illustrative embodiment. Circuitry 800 is a four bit "OR-AND" circuitry. Circuitry 800 includes logic gates 802, 804, 806, and 808 and NAND gate 810. In circuitry 800, none of trueb 812, compb 814, or signal 1 816 are initially grounded or have a drain voltage applied. However, signal 2 818 is tied to drain voltage. Thus, as shown by truth table 602 of FIG. 6, "OR-AND" output 820 occurs when either of signal 1 816 or trueb 812 are 1. All of cmpout signal 822 are fed to NAND gate 810 and inverter 824 to functionally AND all cmpout signals 822.

Figure 9:
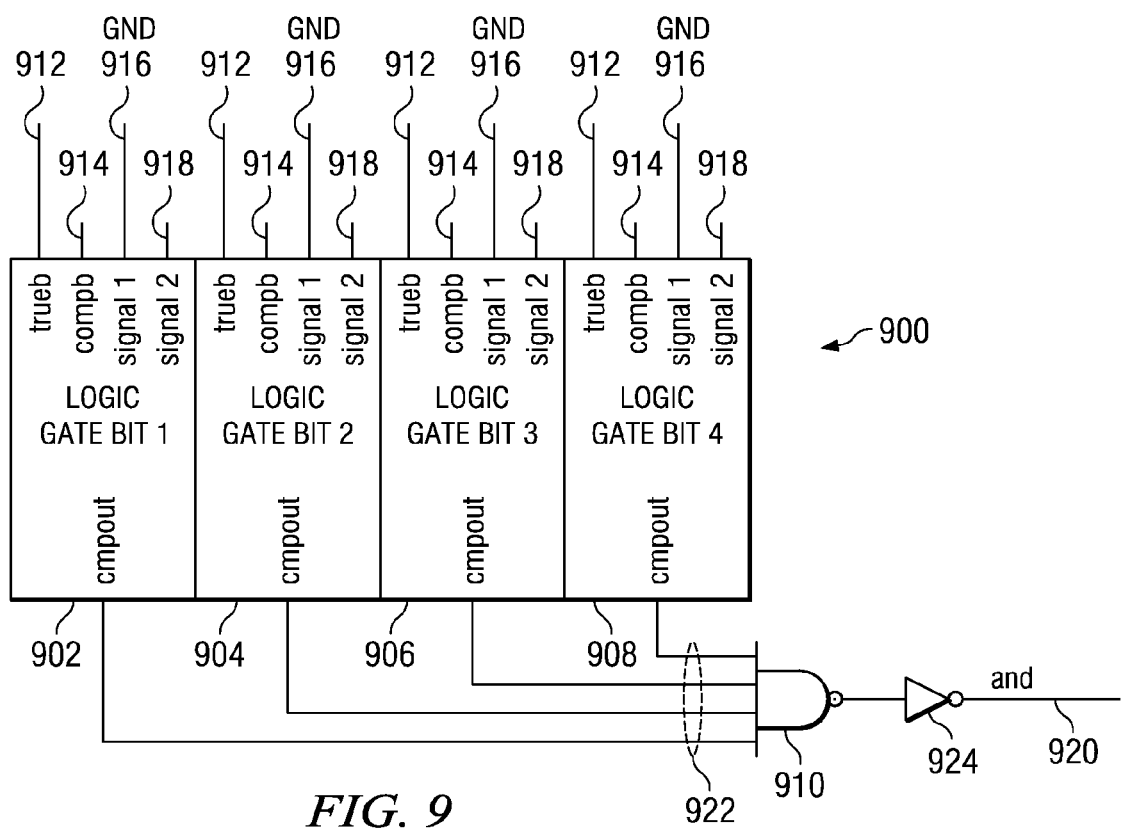
FIG. 9 illustrates an exemplary "AND" function using a logic gate in accordance with an illustrative embodiment.

FIG. 9 illustrates an exemplary "AND" function using a logic gate, such as logic gate 500 of FIG. 5, in accordance with an illustrative embodiment. Circuitry 900 is a four bit "AND" circuitry. Circuitry 900 includes logic gates 902, 904, 906, and 908 and NAND gate 910. In circuitry 900, none of trueb 912, compb 914, or signal 2 918 are initially grounded or have a drain voltage applied. However, signal 1 916 is tied to ground. Thus, as shown by truth table 612 of FIG. 6, "AND" output 920 occurs when signal 2 918 and trueb 912 are 1. All of cmpout signal 922 are fed to NAND gate 910 and inverter 924 to functionally AND all of cmpout signal 922.

Additional features not shown that may be performed by the logic gate may include "overlap" and "contain" checking. In certain cases, it may be necessary to determine if a range of bits in an entry are both 1's in the data and the stored value. The "overlap" case checks if some of the bits are both 1's and the "contain" case checks if all the bits are both 1's. This requires the XOR gate to perform different functions, such as OR or AND, which may be accomplished by changing the inputs to the logic gate. These different sets of inputs may be applied with a decode structure. The decode structure may select which function to perform and apply the appropriate inputs to the gate. In all these cases, the actual storage cell with XOR gate does not need to be changed. All the XOR gate outputs in an entry are combined using an OR, AND, or any other logic function depending on the desired results.

Also, a combination of the "overlap" and "compare" functions may be performed in the same entry with the same storage cell/XOR structure. Ideally, each entry could have all functions to combine the XOR outputs. Then, with the decode structure, any logic function may be achieved per entry without changing the storage cell/XOR structure.

Figure 10:
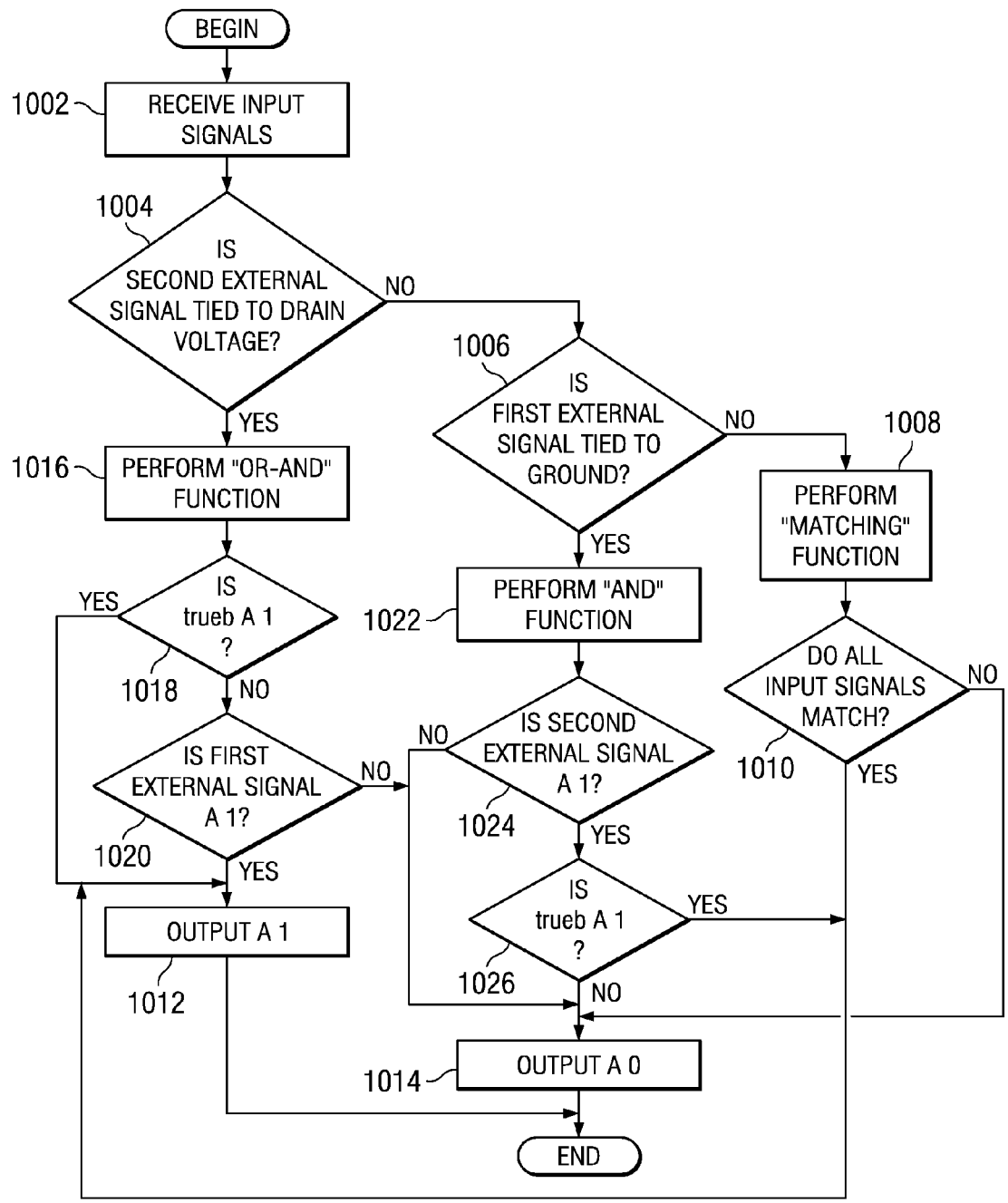
FIG. 10 illustrates a flowchart of the operation performed by a logic circuit in accordance with an illustrative embodiment.

FIG. 10 illustrates a flowchart of the operation performed by a logic circuit, such as logic circuit 500 of FIG. 5, in accordance with an illustrative embodiment. As the operation begins, the logic gate receives input signals (step 1002). The input signals are four input signals, two from the storage cell and two from an external source. The storage cell input signals are labeled trueb and compb and the external input signals are labeled signal 1 and signal 2 or first external signal and second external signal, respectively. The logic gate determines if the second external signal is tied to drain voltage (step 1004). If at step 1004 the second external signal is not tied to the drain voltage, then the logic gate determines if the first external signal is tied to ground (step 1006). If at step 1006, the first external signal is not tied to ground, then the logic gate performs a "matching" function (step 1008). In performing a "matching" function, the logic gate determines if all of the input signals match (step 1010). If at step 1010 all of the input signals match, then the logic gate outputs a 1 or an output high circuitry (step 1012). If at step 1010 all of the input signals do not match, then the logic gate outputs a 0 (step 1014).

Returning to step 1004, if the second external signal is tied to the drain voltage, then the logic gate performs an "OR-AND" function (step 1016). In performing an "OR-AND" function, the logic gate then determines if the trueb signal is 1 (step 1018). If the trueb signal is 1, then the logic gate outputs a 1 or an output high circuitry (step 1012). If at step 1018 the trueb signal is a 0, then the logic gate determines if the first external signal is a 1 (step 1020). If the first external signal is a 1, then the logic gate outputs a 1 or an output high circuitry (step 1012). If at step 1020 the first external signal is a 0, then the logic gate outputs a 0 (step 1014).

Returning to step 1006, if the first external signal is tied to ground, then the logic gate performs an "AND" function (step 1022). In performing an "AND" function, the logic gate determines if the second external signal is a 1 (step 1024). If at step 1024 the second external signal is not a 1, then the logic gate outputs a 0 (step 1014). If at step 1024 the second logic gate is a 1, then the logic gate determines if trueb is a 1 (step 1026). If at step 1026 the trueb signal is not a 1, then the logic gate outputs a 0 (step 1014). If at step 1026 the trueb signal is a 1, then the logic gate outputs a 1 or an output high circuitry (step 1012), with the operation terminating thereafter.

Thus, the illustrative embodiments provide a logic gate that implements complex logic within a memory array. An output node is coupled to a fist input circuitry and a second input circuitry. An output drive circuitry is coupled to the output node and a logic gate output node. The logic gate receives at least three of a first storage cell signal, a second storage cell signal, a first external signal, or a second external signal at the first input circuitry and the second input circuitry. The logic gate performs one of a set of logic functions using the first storage cell signal, the second storage cell signal, the first external signal, or the second external signal. The set of logic functions includes at least one of a matching function, an OR-AND function, or an AND function.

The circuit as described above is part of the design for an integrated circuit chip. The chip design is created in a graphical computer programming language and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A method of operating a logic gate, which includes a first input circuitry, a second input circuitry, an output drive circuitry, and a logic gate output node, for implementing complex logic within a memory array, wherein an output node is coupled to the first input circuitry and the second input circuitry, and wherein the output drive circuitry is coupled to the output node and the logic gate output node, the method comprising the steps of:

receiving, by the first input circuitry, a first storage cell signal, a second storage cell signal, and a first external signal;

receiving, by the second input circuitry, the first storage cell signal, the second storage cell signal, and a second external signal;

wherein the same first storage cell signal and the same second storage cell signal are received by both the first input circuitry and the second input circuitry;

performing, in the logic gate, one of a set of logic functions using the first storage cell signal, the second storage cell signal, the first external signal, or the second external signal;

wherein the first input circuitry includes:

a first pull-up transistor connected to the first storage cell signal;

a second pull-up transistor connected to the first external signal;

a first pull-down transistor connected to the first external signal; and a second pull-down transistor connected to the second storage cell signal, wherein a drain of the first pull-up transistor is coupled to a source of the second pull-up transistor, wherein the first pull-down transistor is coupled to the second pull-down transistor, wherein the first pull-up transistor is coupled to a drain voltage, wherein the second pull-down transistor is coupled to a ground, and wherein the second pull-up transistor is coupled to the first pull-down transistor and to the output node; and wherein the second input circuitry includes:

a first pull-up transistor connected to the second storage cell signal;

a second pull-up transistor connected to the second external signal;

a first pull-down transistor connected to the second external signal; and a second pull-down transistor connected to the first storage cell signal wherein a drain of the first pull-up transistor is coupled to a source of the second pull-up transistor, wherein the first pull-down transistor is coupled to the second pull-down transistor, wherein the first pull-up transistor is coupled to a drain voltage, wherein the second pull-down transistor is coupled to a ground, and wherein the second pull-up transistor is coupled to the first pull-down transistor and to the output node.

2. The method of claim 1, wherein the set of logic functions includes at least one of a matching function, an OR-AND function, or an AND function.

3. The method of claim 2, wherein performing the matching function comprises:

outputting an output high signal on the logic gate output node when the first storage cell signal, the second storage cell signal, the first external signal, and the second external signal have matching inputs, wherein the first storage cell signal and the second storage cell signal are complements and the first external signal and the second external signal are complements.

4. The method of claim 2, wherein performing the OR-AND function comprises:

tying the second external signal to a high signal; and outputting an output high signal on the logic gate output node when at least one of the first storage cell signal, the second storage cell signal, or the first external signal is active, wherein the first storage cell signal and second storage cell signal are complements.

5. The method of claim 2, wherein performing the AND function comprises:

tying the first external signal to a low signal; and outputting an output high signal on the logic gate output node when the second storage cell signal and the second external signal are active, wherein the first storage cell signal and the second storage cell signal are complements.

6. The method of claim 1, wherein the first pull-up transistor, the second pull-up transistor, the first pull-down transistor, and the second pull-down transistors of the first input circuitry are field-effect transistors.

7. The method of claim 1, wherein the first pull-up transistor, the second pull-up transistor, the first pull-down transistor, and the second pull-down transistors are field-effect transistors of the second input circuitry.

8. The method of claim 1, further comprising:

outputting an output high signal based on a condition being met by one of the set of logic functions using the output drive circuitry, wherein the output drive circuitry comprises an inverter coupled between the output node and the logic gate output node.

* * * * *